United States Patent
Swoboda (10) Patent No.: US 7,924,050 B2
(45) Date of Patent: *Apr. 12, 2011

(54) KEY BASED PIN SHARING SELECTION

(75) Inventor: Gary L. Swoboda, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

This patent is subject to a terminal disclaimer.

(21) Appl. No.: 12/486,922

(22) Filed: Jun. 18, 2009

(65) Prior Publication Data

US 2009/0315587 A1  Dec. 24, 2009

Related U.S. Application Data (60) Provisional application No. 61/074,786, filed on Jun. 23, 2008.

(51) Int. Cl.
*H03K 19/173* (2006.01)
*H03K 19/0175* (2006.01)
(52) U.S. Cl. .............. 326/38; 326/93; 326/62
(58) Field of Classification Search .............. 326/38, 326/41, 47, 93, 101
See application file for complete search history.

(56) References Cited

U.S. PATENT DOCUMENTS

| | | | | |
|---|---|---|---|---|
| 5,107,230 A | * | 4/1992 | King | 326/86 |
| 5,500,611 A | * | 3/1996 | Popat et al. | 326/87 |
| 6,825,687 B2 | * | 11/2004 | Keshavarzi et al. | 326/34 |
| 2004/0122541 A1 | * | 6/2004 | DiSanza et al. | 700/94 |

* cited by examiner

*Primary Examiner* — Rexford N Barnie
*Assistant Examiner* — Jany Tran
(74) *Attorney, Agent, or Firm* — Robert D. Marshall, Jr.; W. James Brady; Frederick J. Telecky, Jr.

(57) ABSTRACT

This invention is an integrated circuit having at least one data pin connecting to external circuits. The invention plural operational units each having a normal mode and a stall mode controlled by an enable input. Selection logic selectively enables an operation unit and connects the data input/output of the enabled operation unit to the data pin. The operational units are responsive to a preceding or following key to enter the normal mode. Each operational unit switches between stall mode and the normal mode upon receiving a corresponding predetermined selection number of pulses at while the clock input receives a non-cycling signal. Greater number of pulses deselect all operational units, switch operational units to the normal mode if the correct key is received and switch all operational units to the stall mode.

5 Claims, 6 Drawing Sheets

KEY BASED PIN SHARING SELECTION

CLAIM OF PRIORITY

This application claims priority under 35 U.S.C. 119(e)(1) to U.S. Provisional Application No. 61/074,786 filed Jun. 23, 2008.

TECHNICAL FIELD OF THE INVENTION

The technical field of this invention is integrated circuit external signaling.

BACKGROUND OF THE INVENTION

Advanced wafer lithography and surface-mount packaging technology are integrating increasingly complex functions at both the silicon and printed circuit board level of electronic design. Diminished physical access to circuits for test and emulation is an unfortunate consequence of denser designs and shrinking interconnect pitch. Designed-in testability is needed so the finished product is both controllable and observable during test and debug. Any manufacturing defect is preferably detectable during final test before a product is shipped. This basic necessity is difficult to achieve for complex designs without taking testability into account in the logic design phase so automatic test equipment can test the product.

In addition to testing for functionality and for manufacturing defects, application software development requires a similar level of simulation, observability and controllability in the system or sub-system design phase. The emulation phase of design should ensure that a system of one or more ICs (integrated circuits) functions correctly in the end equipment or application when linked with the system software. With the increasing use of ICs in the automotive industry, telecommunications, defense systems, and life support systems, thorough testing and extensive real-time debug becomes a critical need.

Functional testing, where the designer generates test vectors to ensure conformance to specification, still remains a widely used test methodology. For very large systems this method proves inadequate in providing a high level of detectable fault coverage. Automatically generated test patterns are desirable for full testability, and controllability and observability. These are key goals that span the full hierarchy of test from the system level to the transistor level.

Another problem in large designs is the long time and substantial expense involved in design for test. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation plan, a large amount of subsequent design time would be expended on test pattern creation and upgrading.

Even if a significant investment were made to design a module to be reusable and to fully create and grade its test patterns, subsequent use of a module may bury it in application specific logic. This would make its access difficult or impossible. Consequently, it is desirable to avoid this pitfall.

The advances of IC design are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment and tighter tolerances.

Emulation technology utilizing scan based emulation and multiprocessing debug was introduced more than 10 years ago. In 1988, the change from conventional in circuit emulation to scan based emulation was motivated by design cycle time pressures and newly available space for on-chip emulation. Design cycle time pressure was created by three factors. Higher integration levels, such as increased use of on-chip memory, demand more design time. Increasing clock rates mean that emulation support logic causes increased electrical intrusiveness. More sophisticated packaging causes emulator connectivity issues. Today these same factors, with new twists, are challenging the ability of a scan based emulator to deliver the system debug facilities needed by today's complex, higher clock rate, highly integrated designs. The resulting systems are smaller, faster, and cheaper. They have higher performance and footprints that are increasingly dense. Each of these positive system trends adversely affects the observation of system activity, the key enabler for rapid system development. The effect is called "vanishing visibility."

Figure 1:
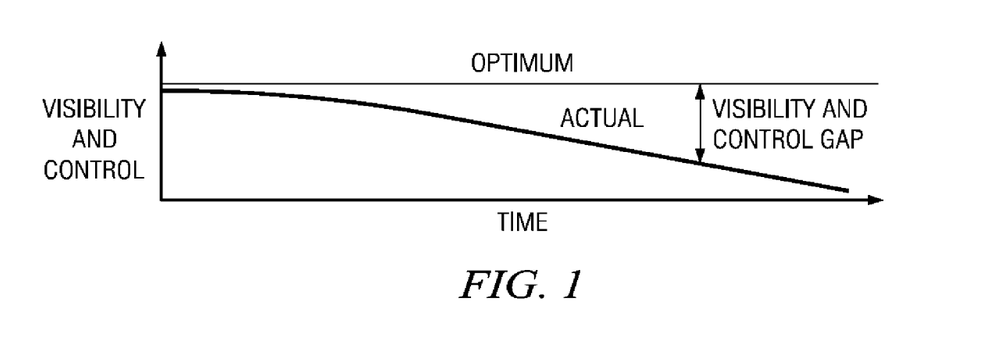
FIG. 1 illustrates the visibility and control of typical integrated circuits as a function of time due to increasing system integration.

FIG. 1 illustrates the trend in visibility and control over time and greater system integration. Application developers prefer the optimum visibility level illustrated in FIG. 1. This optimum visibility level provides visibility and control of all relevant system activity. The steady progression of integration levels and increases in clock rates steadily decrease the actual visibility and control available over time. These forces create a visibility and control gap, the difference between the optimum visibility and control level and the actual level available. Over time, this gap will widen. Application development tool vendors are striving to minimize the gap growth rate. Development tools software and associated hardware components must do more with less resources and in different ways. Tackling this ease of use challenge is amplified by these forces.

With today's highly integrated System-On-a-Chip (SOC) technology, the visibility and control gap has widened dramatically over time. Traditional debug options such as logic analyzers and partitioned prototype systems are unable to keep pace with the integration levels and ever increasing clock rates of today's systems. As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed. Thus the system components were built in a way that enabled the construction of prototyping systems with exposed buses. This approach is also under siege from the ever-increasing march of system clock rates. As the central processing unit (CPU) clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. In the current era production devices must serve as the platform for application development.

Increasing CPU clock rates are also limiting availability of other simple visibility mechanisms. Since the CPU clock rates can exceed the maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity. As visibility and control diminish, the development tools used to develop the application become less productive. The tools also appear harder to use due to the increasing tool complexity required to maintain visibility and control. The visibility, control, and ease of use issues created by systems-on-a-chip tend to lengthen product development cycles.

Even as the integration trends present developers with a tough debug environment, they also present hope that new approaches to debug problems will emerge. The increased densities and clock rates that create development cycle time pressures also create opportunities to solve them. On-chip, debug facilities are more affordable than ever before. As high speed, high performance chips are increasingly dominated by very large memory structures, the system cost associated with the random logic accompanying the CPU and memory subsystems is dropping as a percentage of total system cost. The incremental cost of several thousand gates is at an all time low. Circuits of this size may in some cases be tucked into a corner of today's chip designs. The incremental cost per pin in today's high density packages has also dropped. This makes it easy to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs. Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

Figure 2:
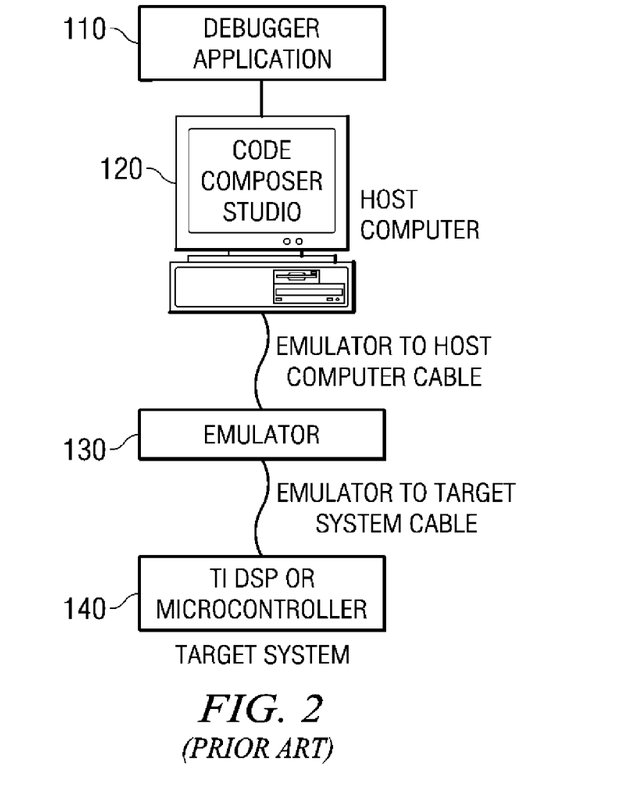
FIG. 2 illustrates an emulation system to which this invention is applicable (prior art)

FIG. 2 illustrates a prior art emulator system including four emulator components. These four components are: a debugger application program 110; a host computer 120; an emulation controller 130; and on-chip debug facilities 140. FIG. 2 illustrates the connections of these components. Host computer 120 is connected to an emulation controller 130 external to host 120. Emulation controller 130 is also connected to target system 140. The user preferably controls the target application on target system 140 through debugger application program 110.

Host computer 120 is generally a personal computer. Host computer 120 provides access the debug capabilities through emulator controller 130. Debugger application program 110 presents the debug capabilities in a user-friendly form via host computer 120. The debug resources are allocated by debug application program 110 on an as needed basis, relieving the user of this burden. Source level debug utilizes the debug resources, hiding their complexity from the user. Debugger application program 110 together with the on-chip trace and triggering facilities provide a means to select, record, and display chip activity of interest. Trace displays are automatically correlated to the source code that generated the trace log. The emulator provides both the debug control and trace recording function.

The debug facilities are preferably programmed using standard emulator debug accesses through a JTAG or similar serial debug interface. Since pins are at a premium, the preferred embodiment of the invention provides for the sharing of the debug pin pool by trace, trigger, and other debug functions with a small increment in silicon cost. Fixed pin formats may also be supported. When the pin sharing option is deployed, the debug pin utilization is determined at the beginning of each debug session before target system 140 is directed to run the application program. This maximizes the trace export bandwidth. Trace bandwidth is maximized by allocating the maximum number of pins to trace.

The debug capability and building blocks within a system may vary. Debugger application program 110 therefore establishes the configuration at runtime. This approach requires the hardware blocks to meet a set of constraints dealing with configuration and register organization. Other components provide a hardware search capability designed to locate the blocks and other peripherals in the system memory map. Debugger application program 110 uses a search facility to locate the resources. The address where the modules are located and a type ID uniquely identifies each block found. Once the IDs are found, a design database may be used to ascertain the exact configuration and all system inputs and outputs.

Host computer 120 generally includes at least 64 Mbytes of memory and is capable of running Windows 95, SR-2, Windows NT, or later versions of Windows. Host computer 120 must support one of the communications interfaces required by the emulator. These may include: Ethernet 10T and 100T; TCP/IP protocol; Universal Serial Bus (USB); Firewire IEEE 1394; and parallel port such as SPP, EPP and ECP.

Host computer 120 plays a major role in determining the real-time data exchange bandwidth. First, the host to emulator communication plays a major role in defining the maximum sustained real-time data exchange bandwidth because emulator controller 130 must empty its receive real-time data exchange buffers as fast as they are filled. Secondly, host computer 120 originating or receiving the real-time data exchange data must have sufficient processing capacity or disc bandwidth to sustain the preparation and transmission or processing and storing of the received real-time data exchange data. A state of the art personal computer with a Firewire communication channel (IEEE 1394) is preferred to obtain the highest real-time data exchange bandwidth. This bandwidth can be as much as ten times greater performance than other communication options.

Emulation controller 130 provides a bridge between host computer 120 and target system 140. Emulation controller 130 handles all debug information passed between debugger application program 110 running on host computer 120 and a target application executing on target system 140. A presently preferred minimum emulator configuration supports all of the following capabilities: real-time emulation; real-time data exchange; trace; and advanced analysis.

Emulation controller 130 preferably accesses real-time emulation capabilities such as execution control, memory, and register access via a 3, 4, or 5 bit scan based interface. Real-time data exchange capabilities can be accessed by scan or by using three higher bandwidth real-time data exchange formats that use direct target to emulator connections other than scan. The input and output triggers allow other system components to signal the chip with debug events and vice-versa. Bit I/O allows the emulator to stimulate or monitor system inputs and outputs. Bit I/O can be used to support factory test and other low bandwidth, non-time-critical emulator/target operations. Extended operating modes are used to specify device test and emulation operating modes. Emulator controller 130 is partitioned into communication and emulation sections. The communication section supports host communication links while the emulation section interfaces to the target, managing target debug functions and the device debug port. Emulation controller 130 communicates with host computer 120 using one of industry standard communication links outlined earlier herein. The host to emulator connection is established with off the shelf cabling technology. Host to emulator separation is governed by the standards applied to the interface used.

Emulation controller 130 communicates with the target system 140 through a target cable or cables. Debug, trace, triggers, and real-time data exchange capabilities share the target cable, and in some cases, the same device pins. More than one target cable may be required when the target system 140 deploys a trace width that cannot be accommodated in a single cable. All trace, real-time data exchange, and debug communication occurs over this link. Emulator controller 130 preferably allows for a target to emulator separation of at least two feet. This emulation technology is capable of test clock rates up to 50 MHZ and trace clock rates from 200 to 300 MHZ, or higher. Even though the emulator design uses techniques that should relax target system 140 constraints, signaling between emulator controller 130 and target system 140 at these rates requires design diligence. This emulation technology may impose restrictions on the placement of chip debug pins, board layout, and requires precise pin timings. On-chip pin macros are provided to assist in meeting timing constraints.

The on-chip debug facilities offer the developer a rich set of development capability in a two tiered, scalable approach. The first tier delivers functionality utilizing the real-time emulation capability built into a CPU's mega-modules. This real-time emulation capability has fixed functionality and is permanently part of the CPU while the high performance real-time data exchange, advanced analysis, and trace functions are added outside of the core in most cases. The capabilities are individually selected for addition to a chip. The addition of emulation peripherals to the system design creates the second tier functionality. A cost-effective library of emulation peripherals contains the building blocks to create systems and permits the construction of advanced analysis, high performance real-time data exchange, and trace capabilities. In the preferred embodiment five standard debug configurations are offered, although custom configurations are also supported. The specific configurations are covered later herein.

SUMMARY OF THE INVENTION

This invention is an integrated circuit having at least one data pin connecting to external circuits. The invention includes a plurality of operational units each having at least one data input/output for data transfer and an enable input. The operational unit have a normal mode and a stall mode controlled by an enable input. The operational units can exchange data via the data input/output in normal mode and are not capable of exchanging data in the stall mode. A selection logic selectively enables an operation unit and connects the data input/output of the enabled operation unit to the at least one data pin. The selection logic is responsive to external signals on at least one data pin to selectively enable operation units. The operational units are responsive to a preceding or following key to enter the normal mode.

Each operational unit includes a clock input. The selection logic includes a clock output for each operational unit. This clock output supplies a cycling clock signal to each operational unit in the normal mode. This clock output supplies a non-cycling signal to each operational unit operational unit in the stall mode. Each operational unit switches between stall mode and the normal mode upon receiving a corresponding predetermined selection number of pulses while the clock input receives said non-cycling signal. All operational units are deselected upon receiving a number of pulses greater than the greatest selection number. The operational units switch to the normal mode upon receiving more than an even greater number of pulses if the correct key is received. Lastly, all operational units switch to the stall mode upon receiving more than an even greater number of pulses. Each operational unit exchanges signals via a corresponding protocol when in said normal mode. Each operational unit includes inputs connected to operating circuits of the integrated circuit and transmits signals corresponding to said inputs on said at least one data line when in normal mode.

BRIEF DESCRIPTION OF THE DRAWINGS

These and other aspects of this invention are illustrated in the drawings, in which.

DETAILED DESCRIPTION OF PREFERRED EMBODIMENTS

Figure 3:
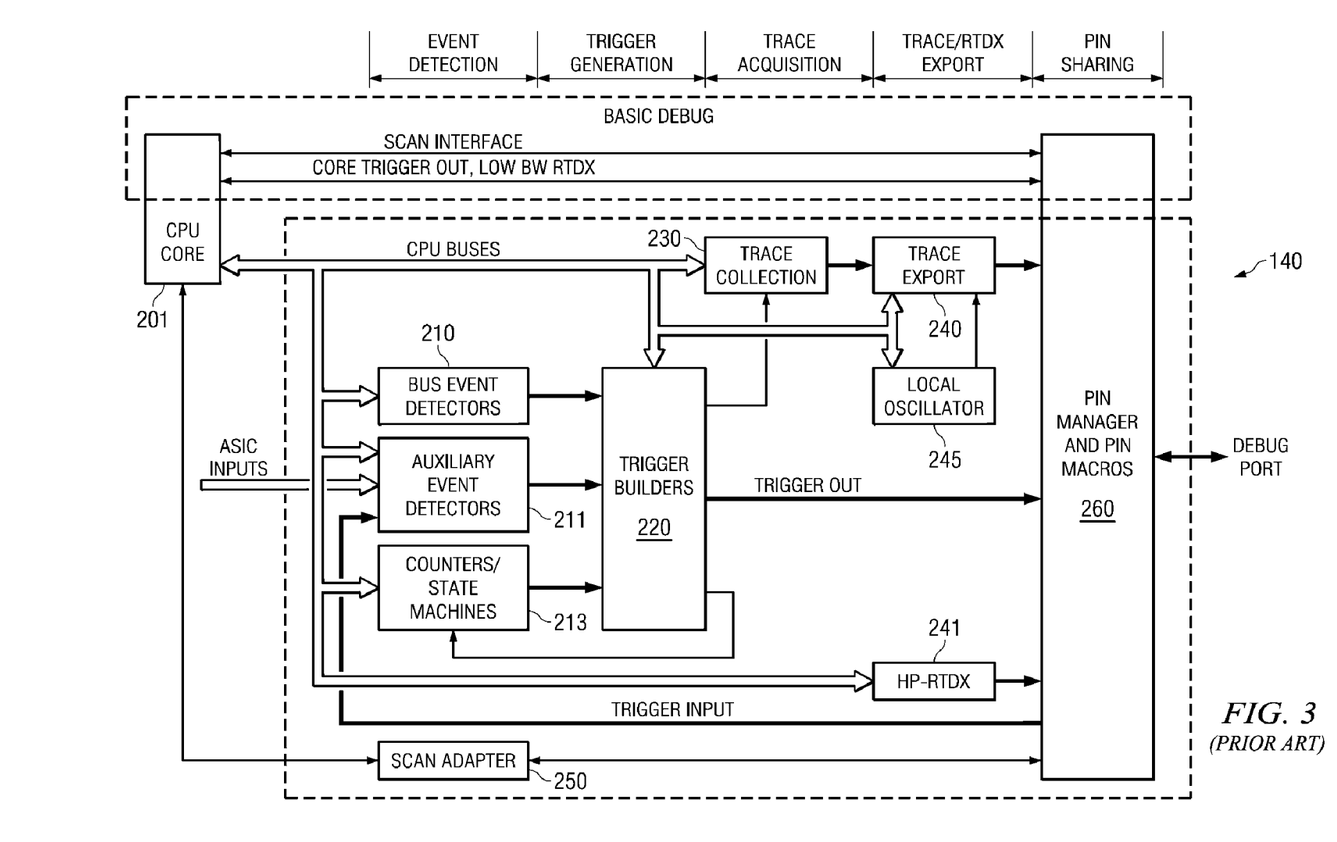
FIG. 3 illustrates in block diagram form a typical integrated circuit employing configurable emulation capability (prior art)

FIG. 3 illustrates a prior art example of one on-chip debug architecture embodying target system 140. The architecture uses several module classes to create the debug function. One of these classes is event detectors including bus event detectors 210, auxiliary event detectors 211 and counters/state machines 213. A second class of modules is trigger generators including trigger builders 220. A third class of modules is data acquisition including trace collection 230 and formatting. A fourth class of modules is data export including trace export 240, and real-time data exchange export 241. Trace export 240 is controlled by clock signals from local oscillator 245. Local oscillator 245 will be described in detail below. A final class of modules is scan adaptor 250, which interfaces scan input/output to CPU core 201. Final data formatting and pin selection occurs in pin manager and pin micros 260.

The size of the debug function and its associated capabilities for any particular embodiment of a system-on-chip may be adjusted by either deleting complete functions or limiting the number of event detectors and trigger builders deployed. Additionally, the trace function can be incrementally increased from program counter trace only to program counter and data trace along with ASIC and CPU generated data. The real-time data exchange function may also be optionally deployed. The ability to customize on-chip tools changes the application development paradigm. Historically, all chip designs with a given CPU core were limited to a fixed set of debug capability. Now, an optimized debug capability is available for each chip design. This paradigm change gives system architects the tools needed to manage product development risk at an affordable cost. Note that the same CPU core may be used with differing peripherals with differing pin outs to embody differing system-on-chip products. These differing embodiments may require differing debug and emulation resources. The modularity of this invention permits each such embodiment to include only the necessary debug and emulation resources for the particular system-on-chip application.

The real-time emulation debug infrastructure component is used to tackle basic debug and instrumentation operations related to application development. It contains all execution control and register visibility capabilities and a minimal set of real-time data exchange and analysis such as breakpoint and watchpoint capabilities. These debug operations use on-chip hardware facilities to control the execution of the application and gain access to registers and memory. Some of the debug operations which may be supported by real-time emulation are: setting a software breakpoint and observing the machine state at that point; single step code advance to observe exact instruction by instruction decision making; detecting a spurious write to a known memory location; and viewing and changing memory and peripheral registers.

Real-time emulation facilities are incorporated into a CPU mega-module and are woven into the fabric of CPU core 201. This assures designs using CPU core 201 have sufficient debug facilities to support debugger application program 110 baseline debug, instrumentation, and data transfer capabilities. Each CPU core 201 incorporates a baseline set of emulation capabilities. These capabilities include but are not limited to: execution control such as run, single instruction step, halt and free run; displaying and modifying registers and memory; breakpoints including software and minimal hardware program breakpoints; and watchpoints including minimal hardware data breakpoints.

The execution control facilities offer two modes of operation, stop mode and real-time. These modes differ as to how CPU core 201 handles maskable interrupts, non-maskable interrupts, and reset after code execution is halted. The halt of code execution can be caused by the user from debugger application program 110 via a keyboard or mouse input, via a software breakpoint or via a hardware breakpoint or watchpoint. All interrupts and resets are disabled at this point when operating in stop mode. In the real-time mode, reset and non-maskable interrupts (NMI) can always be serviced along with those maskable interrupts designated as real-time events. The real-time facilities are implemented without the assistance of a monitor program for CPU cores 201 with pipelines that allow an interrupt between each instruction. A monitor program is required to support real-time operation for those pipelines that do not meet the interrupt between each instruction criteria.

The real-time aspects of this capability provides for the execution of interrupt driven code while the execution of background code is stopped to perform debug operations. Facilities are provided to define each interrupt as either a real-time or a non-real-time event. Interrupts defined as real-time events are continually serviced, even while the debug of background code occurs. Interrupts defined as non-real-time events can be serviced as long as the debug facilities have not stopped the application. The real-time execution of the time critical code is thus transparent to the developer.

The registers of CPU core 201 are viewed when the application has been halted. The register view corresponds to the machine state at the stop point. The debug software and hardware assure that the register activity that occurs as a result of real-time interrupts is transparent to the user. All register changes affect only registers values relative to the stop point. Memory is also displayed and changed relative to the stop point. Alternately, memory may be viewed and changed independent of whether a stop point has occurred. Debug related memory accesses can be constrained to bus cycles where CPU core 201 has not created a memory access. This makes debug related accesses transparent to the application when the these accesses target zero wait state memory.

A shared hardware component provides two hardware breakpoints, an address and data watchpoint or low bandwidth real-time data exchange capabilities. This hardware block also provides a parallel signature analysis function in some implementations. The hardware breakpoints provide a means for setting breakpoints in ROM. The watchpoint provides for the detection of memory read and writes of specific data patterns to an address.

There is a significant advantage to building an integrated circuit that packs many functions on the same pins. The current art generally chooses the function assigned to pins by a selection mechanism built into the chip. This could be by: an applications program writing data into a register; sampling pin values based on an event generated either internal to the chip, such as a power on reset; or an event generated external to the chip, such as an externally supplied reset. This generally sets the function of pins until the next time one of the above set-up mechanisms occurs.

There is a need to set the function of the pin entirely from the pins themselves. It is also desirable to change the pin functions dynamically while the chip is operating. This would permit the functions connected to the pins to be accessed in any order. The functions may have no relationship to each other and use completely different protocols to facilitate their operation. These units may not even share a common set of protocols for addressing the units.

When the units do not share a common addressing mechanism, a means of choosing one of the units to use the pins is needed. This means must be independent of the protocol that each unit uses. Generally the two or more wire interfaces described above have a clock and data signals. The invention described below however also applies to sharing one pin. The clock may be embedded in the data.

Figure 4:
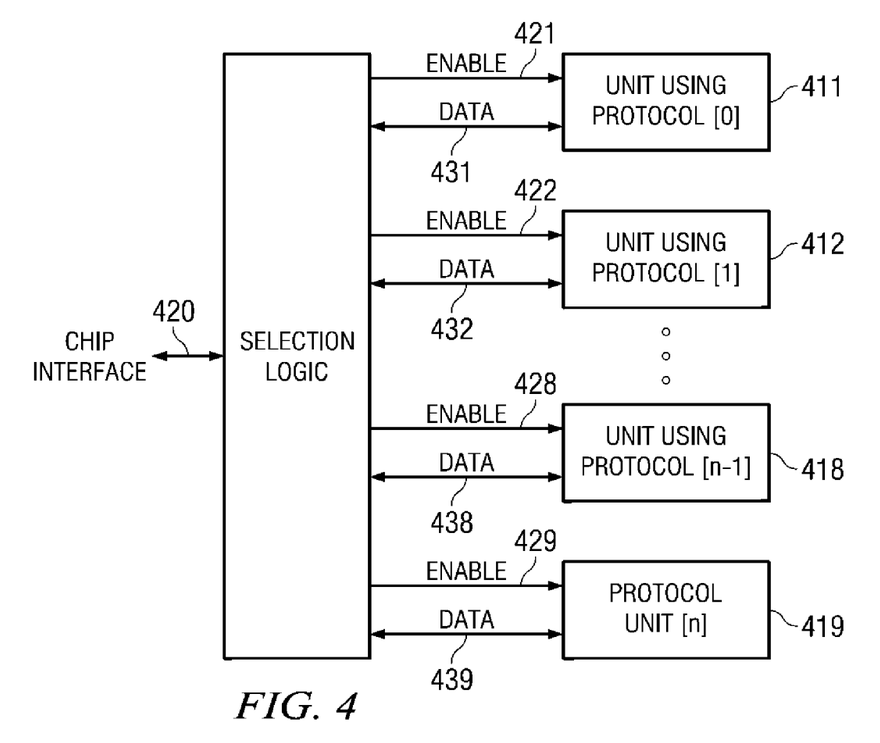
FIG. 4 illustrates a simplified block diagram of an integrated circuit allowing the sharing of one or more pins according to this invention.

FIG. 4 illustrates a simplified block diagram of an integrated circuit allowing the sharing of one or more pins. Selection logic 401 is placed between units 411 to 419 sharing the pins and the pins at the chip interface 420. Units 411 to 419 receive respective enable signals 421 to 429 from selection logic 401. Units 411 to 419 operate in their normal mode to exchange data with chip interface via selection logic 401 and corresponding data lines 431 to 439 when the corresponding enable signal is active. Units 411 to 419 stall their operation when the corresponding enable signal is inactive. Enable signals 421 to 429 may be combined with a clock so that units 411 to 419 are only clocked when they are enabled. Alternatively enable signals 421 to 429 are used in another fashion to control corresponding units 411 to 419. After system reset a particular one unit 411 to 419 may be enabled. Alternatively, no units 411 to 419 are enabled following system reset. More than one unit 411 to 419 may be enabled when these units are aware of each other and comprehend sharing pins in their respective protocols.

Figure 5:
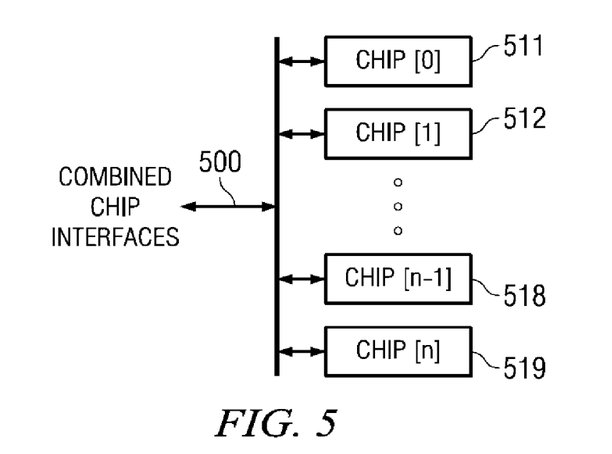
FIG. 5 illustrates a simplified block diagram of the concept of FIG. 4 extended to plural integrated circuit chips.

FIG. 5 illustrates an extension of this concept to multiple chips. Individual chips 511 to 519 share a common combined chip interface 500.

The pin interface sharing technique illustrated in FIG. 3 differs a significantly from systems that use addresses to select units within a chip. In the case where addresses are used the units share an arbitration protocol. The units directly monitor the incoming or outgoing traffic to determine when they are permitted to use the shared chip pins. The present invention also differs from systems where one protocol may be used to switch to another and each protocol is aware of each other's existence.

The example shown FIG. 3 uses a unique signaling sequence not normally used by units 411 to 419 for the selection mechanism. This selection sequence is either ignored by other units or is treated as a no-operation command by the units. In either case units 411 to 419 are operable before the selection sequence and after the selection sequence. The selection sequence can be constructed from any bit pattern appearing at the pins of chip interface 420 that do not appear in the union of the set of bit patterns normally utilized by units 411 to 419. This selection sequence may also use a functional clock.

Figure 6:
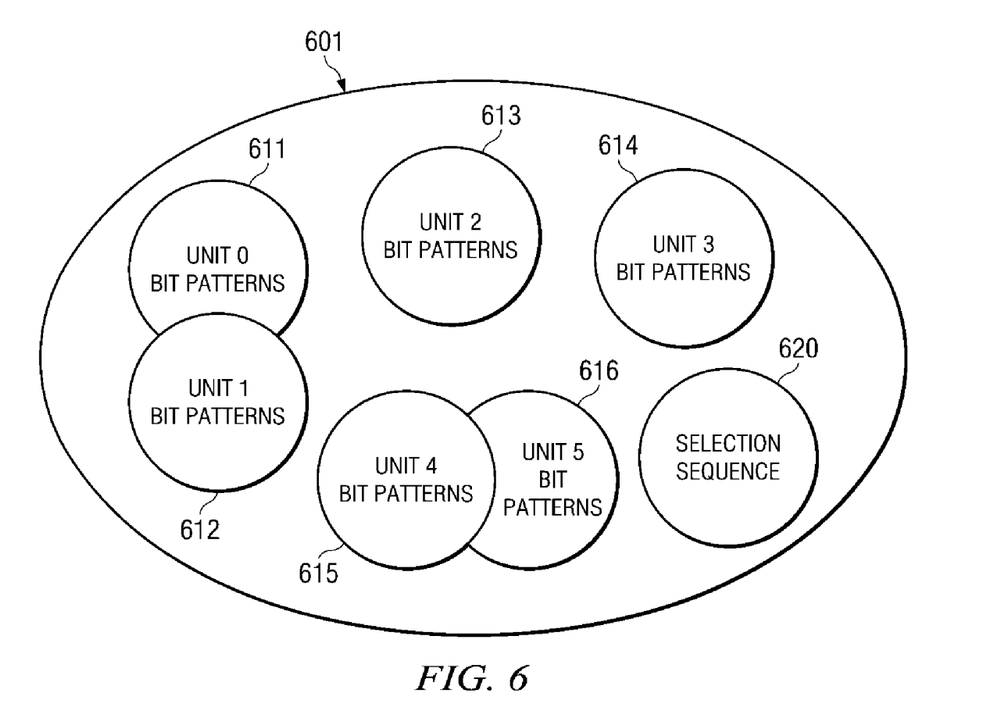
FIG. 6 illustrates an example of a selection sequence space such as may be used in this invention.

FIG. 6 illustrates this selection sequence space. Space 601 represents the total selection space available by the pins of chip interface 402. Sub-space 611 is the space (bit patterns) used by unit 0. Sub-space 612 is the space used by unit 1. Sub-space 613 is the space used by unit 2. Sub-space 614 is the space used by unit 3. Sub-space 615 is the space used by unit 4. Sub-space 616 is the space used by unit 5. Selection of active units is made via selection sequence 620. Selection sequence 620 is within the total selection space 601 but distinct from the sub-spaces 611 to 616 of the units.

This approach is attractive to allow pin sharing by units supporting protocols defined by different standards or units developed by different suppliers that also use different protocols. In most but not all cases, the protocols used by these units are not comprehended by other units. Any of the units may utilize one or more protocols.

Figure 7:
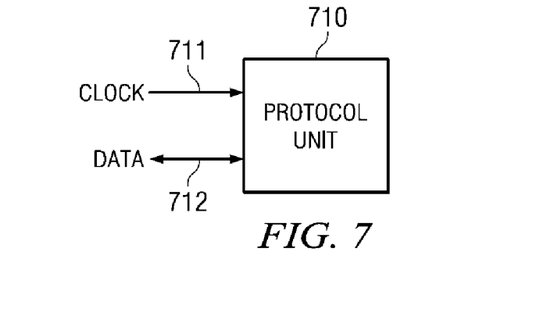
FIG. 7 illustrates an example protocol unit as may be used in this invention.

FIG. 7 illustrates one such sequence that may be used with units that have at least a clock input and data inputs. Protocol unit 710 receives clock signal 711. Protocol unit 710 communicates bi-directionally on data lines 712. This example is illustrative only and does not represent all possible embodiments of this invention.

The previous description presumed that when the selection sequence occurs clock 711 and data lines 712 are driven externally. In our example the data pin is not driven by the chip at the time the selection sequence occurs. The normal signaling space of all protocol units sharing the pins will be the same. The data lines may be driven either externally or by the chip. The data lines can have either zero or one transition per clock period. This signaling space does not represent all possible signaling spaces comprehended by this invention. The signaling space may take many forms all which are included in the invention.

The signaling space available for selection includes many combinations of multiple transitions of the data lines during a clock period or even multiple data transitions while the clock remains either high or low. The latter is chosen for our example.

Figure 8:
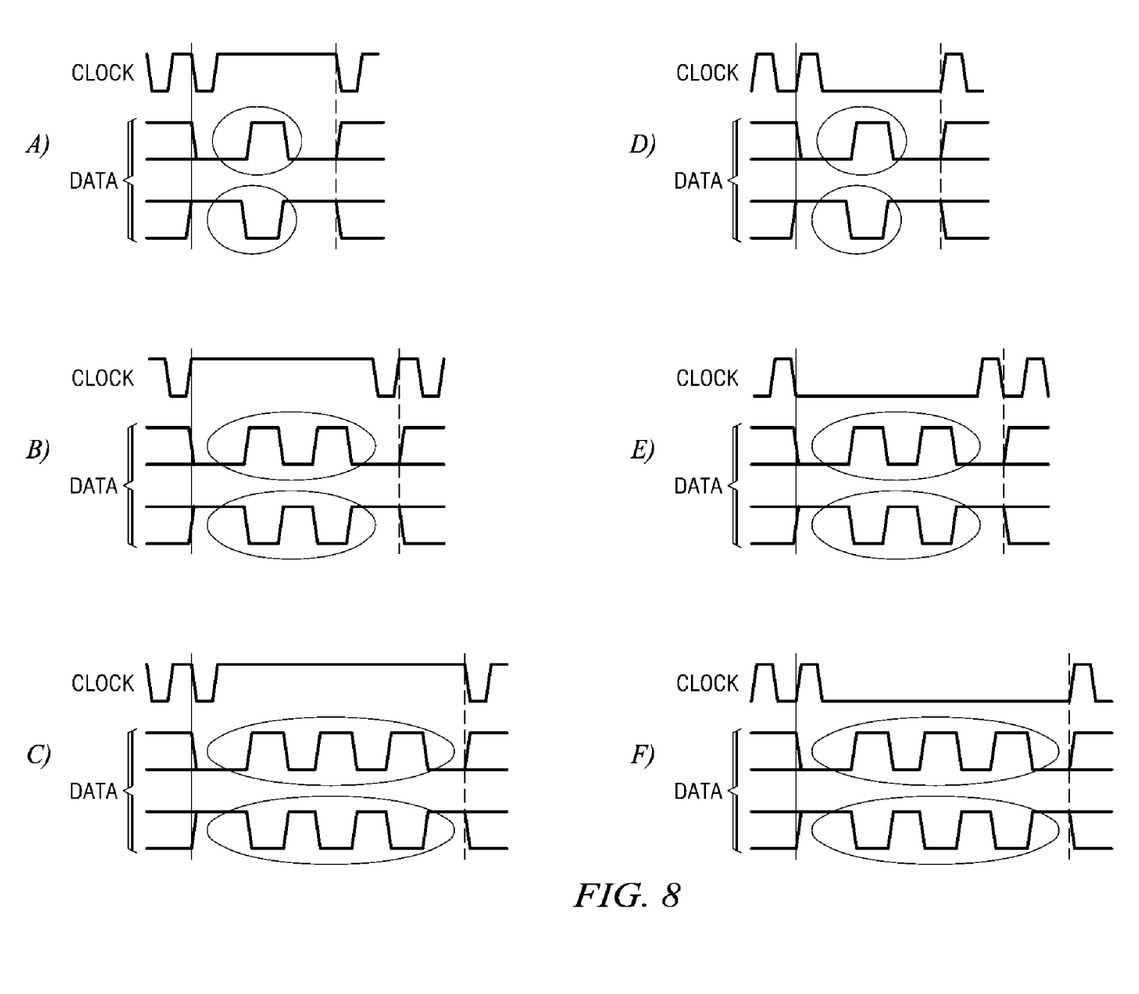
FIG. 8 illustrates examples of signaling during a clock non-cycling time.

FIG. 8 illustrates this signaling. FIG. 8A illustrates a single data pulse transmitted while the clock is held high. FIG. 8B illustrates two data pulses transmitted while the clock is held high. FIG. 8C illustrates three data pulses transmitted while the clock is held high. FIG. 8D illustrates a single data pulse transmitted while the clock is held low. FIG. 8E illustrates two data pulses transmitted while the clock is held low. FIG. 8F illustrates three data pulses transmitted while the clock is held low.

In the previous examples the selection sequence occurs when the clock and data pins are driven externally. The selection sequence could also be chip initiated. In another example the data pin is not driven by the chip when the selection sequence occurs. The normal signaling space of all protocol units sharing the pins will be the same. The data pin may be driven either externally or by the chip. The data line can have either none or one transition per clock period. This signaling space does not represent all possible signaling spaces comprehended by this invention.

In another example the count of the number of rising edges, falling edges or both edges occurring while the clock is static is the selection information. In this example the number of rising edges of the data value while the clock is a static value signals the selected unit 411 to 419. This method of conveying the selection information does not interfere with transmission of normal data while the clock is cycling. The prior data value may be restored before the next edge of the clock.

This invention does not preclude the use of some of the attributes of the signaling sequence by the protocol units. This invention merely requires that there is no duplication in the decoding of the meaning of the selection sequence information by the selection logic and the protocol units. For example, the above signaling example may generate any number of data edges while the clock is high. The counts can be partitioned into groups, each with a different function, some functions used by the protocol units, some functions used by the selection logic and some counts used by both. This invention includes combinations of signaling where functions created by decoding the signaling may be associated with protocol units, some functions used by the selection logic, and some functions used by both. Table 1 shows an example of the sharing of the decoding of the selection signaling between the units and selection logic. The generation of and decoding of selection information may take many forms other than shown Table 1.

TABLE 1

| Data Rising Edge Count while Clock High | Function | No operation for unit | No operation for selection logic |
|---|---|---|---|
| 2 through n | Unit | No | Yes |
| n | All deselected | Yes | No |
| n + 1 | Select if key valid | Yes | Yes |
| >n + 1 | Reset all units | No | No |

As noted in Table 1, for 2 through n received clock edges signaling is used by the units and the selection operation has no operation. For n clock edges received all units are deselected. No unit operation is possible. For n+1 clock edges received selection is made based upon a valid key. All units and the selection logic are inoperable. For more than n+1 received clock edges all units reset. All units and the selection logic are inoperable.

This invention includes using a key preceding or following the special signaling event. The invention includes using a data pattern preceding or following the event causing the selection to determine whether the event is recognized. A predefined data pattern on the data lines prior to the special signaling sequence can be used to trigger one or more instances of event detection. A key of a predetermined length preceding the special signaling sequence may be used to enable a special signaling sequence. The key allows the same special signaling sequence to be used for the same or different purposes. The key identifies multiple versions of the same special signaling event.

Figure 9:
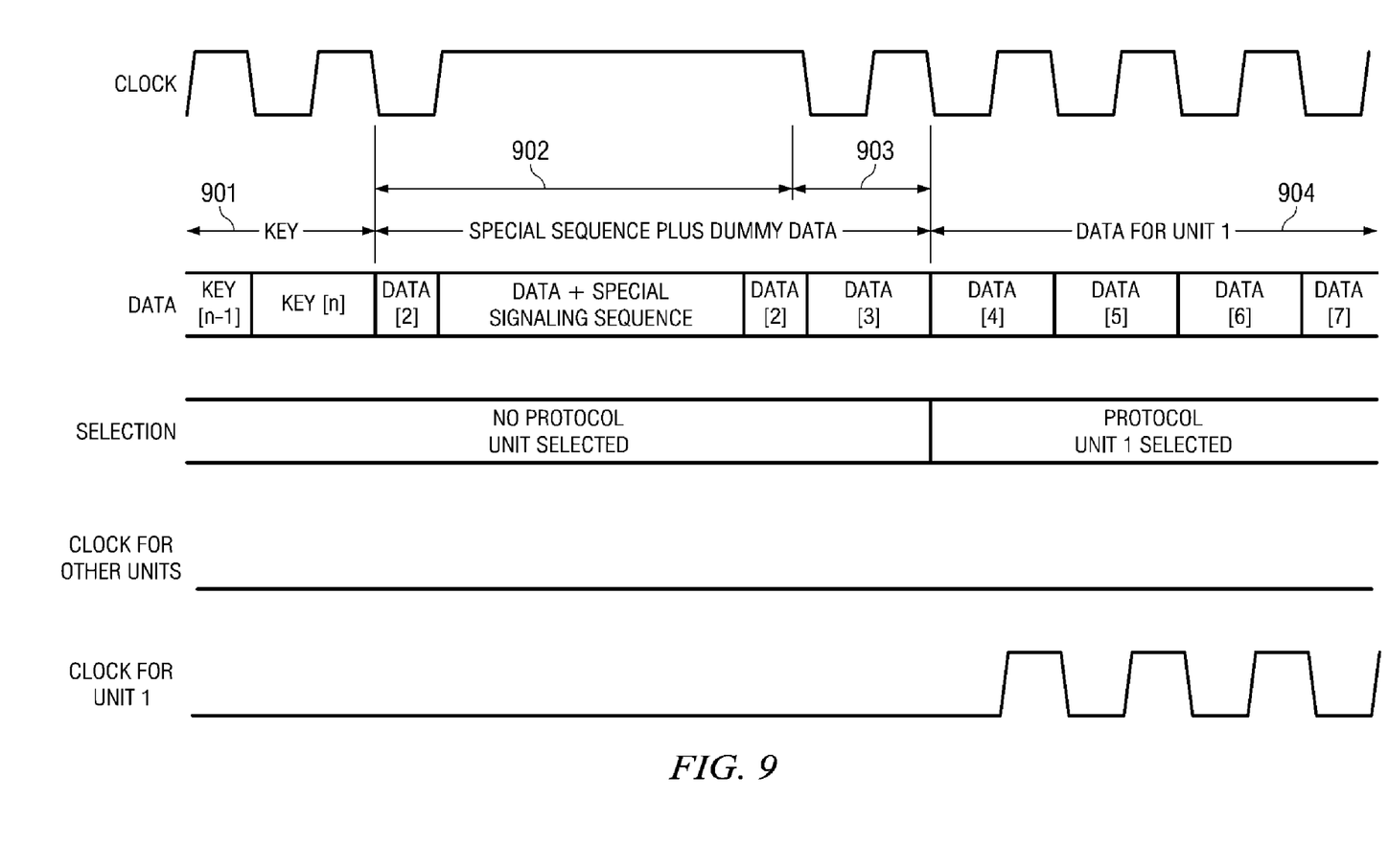
FIG. 9 illustrates an example complex communication according to this invention.

FIG. 9 illustrates an example of the complex signaling possible in this invention. During an interval 901 an external device transmits several keys. FIG. 9 illustrates key[n-1] and key[n]. Interval 902 includes special signaling. The main clock stops cycling an remains high. Interval 902 also includes an interval of exchange of data and a special signaling sequence. During interval 903 the main clock resumes cycling. Dummy data[2] and dummy data[3] are exchanged. During intervals 901, 902 and 903 no unit protocol has been selected. During interval 904 the protocol for unit 1 is selected. The clock for unit 1 resumes cycling during interval 904 while the clocks to other units remain low. Data[4], data[5], data[6] and data[7] are exchanged during interval 904.

The selection information and use of a key may be utilized in many forms other than shown FIG. 9. A typical use of special signaling may include the following sequence following reset:

Deselect all units;

Key and select if the key is valid, thus selecting all units recognizing the key;

Use a selected unit for specific sequences as many times as desired;

Deselect all;

Key and select if the key is valid selecting all units recognizing the key;

Use a selected unit for specific sequences as many times as desired; and

Continue.

What is claimed is:

1. An integrated circuit comprising:
   at least one data pin connecting the integrated circuit to circuits external to the integrated circuit;
   a plurality of operational units, each including at least one data input/output for data transfer, an enable input and a clock input, a predetermined enable signal on said enable input placing said operational unit in a normal mode to exchange data via said at least one data input/output and a predetermined not-enable signal on said enable input placing said operational unit in a stall mode not capable of exchanging data via said at least one data input/output;
   a selection logic including a plurality of enable lines each connected to an enable input of a corresponding operational unit, a plurality of data lines, a data line connected to each of said at least one data input/output of each operational unit and connected to said data pin, and a plurality of clock outputs equal in number to the number of operational units, each clock output connected to a clock input of a corresponding operational unit, said selection logic selectively supplying a key and enabling an operation unit and connecting said data input/output of said enabled operation unit to said at least one data pin, and said selection logic further supplying a cycling clock signal via said corresponding clock output to each operational unit in said normal mode and a non-cycling signal via said corresponding clock output to each operational unit operational unit in said stall mode.

2. The integrated circuit of claim 1, wherein:
   each operational unit switches between said stall mode and said normal mode upon receiving a corresponding predetermined selection number of pulses at said at least one data input/output while said clock input receives said non-cycling signal.

3. The integrated circuit of claim 2, wherein:
   each operational unit switches to said stall mode upon receiving a corresponding predetermined deselect number of pulses at said at least one data input/output while said clock input receives said non-cycling signal, said deselect number greater than said selection number of pulses of all operational units.

4. The integrated circuit of claim 3, wherein:
   each operational unit switches between said stall mode and said normal mode upon receiving a corresponding predetermined key selection number of pulses at said at least one data input/output while said clock input receives said non-cycling signal if a valid key is received, said key selection number greater than said deselect number of pulses.

5. The integrated circuit of claim 4, wherein:
   all operational units switch to said stall mode upon receiving more than a reset predetermined number of pulses at said at least on data input/output while said clock input receives said non-cycling signal, said reset number greater than said key selection number.

* * * * *